United States Patent
Gathman et al.

(10) Patent No.: US 10,651,864 B2
(45) Date of Patent: May 12, 2020

(54) TIME-INTERLEAVED CHARGE SAMPLER RECEIVER

(71) Applicant: QUALCOMM Incorporated, San Diego, CA (US)

(72) Inventors: Timothy Donald Gathman, San Diego, CA (US); Yuhua Guo, San Diego, CA (US); Lai Kan Leung, San Marcos, CA (US); Elias Dagher, Laguna Niguel, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/962,967

(22) Filed: Apr. 25, 2018

(65) Prior Publication Data

US 2019/0334539 A1  Oct. 31, 2019

(51) Int. Cl.
| | |
|---|---|
| H03M 1/00 | (2006.01) |
| H03M 1/12 | (2006.01) |
| H04B 1/16 | (2006.01) |
| H03F 3/45 | (2006.01) |
| H03F 3/19 | (2006.01) |
| H03F 3/24 | (2006.01) |
| H03M 1/52 | (2006.01) |
| G04F 5/00 | (2006.01) |
| H03M 1/54 | (2006.01) |
| G11C 27/02 | (2006.01) |

(52) U.S. Cl.
CPC ....... *H03M 1/1245* (2013.01); *H03M 1/1215* (2013.01); *H04B 1/16* (2013.01); *G04F 5/00* (2013.01); *G11C 27/02* (2013.01); *H03F 3/19* (2013.01); *H03F 3/245* (2013.01); *H03F 3/45475* (2013.01); *H03F 2200/165* (2013.01); *H03F 2200/171* (2013.01); *H03F 2200/294* (2013.01); *H03F 2200/451* (2013.01); *H03M 1/124* (2013.01); *H03M 1/52* (2013.01); *H03M 1/54* (2013.01)

(58) Field of Classification Search
CPC ...... H03M 1/124; H03M 1/1245; H03M 1/52; H03M 1/54; G04F 5/00; G11C 27/02; H04B 1/10; H04B 1/0017
USPC .......... 341/141, 122, 123, 124; 327/91, 291; 375/346, 350
See application file for complete search history.

(56) References Cited

U.S. PATENT DOCUMENTS

| | | |
|---|---|---|
| 7,551,114 B2 | 6/2009 | Joy et al. |
| 9,178,528 B1 | 11/2015 | Waltari |
| 9,608,652 B2 | 3/2017 | Lee et al. |
| 2010/0264751 A1 | 10/2010 | Iida et al. |

(Continued)

OTHER PUBLICATIONS

Fang J., et al., "A 5-GS/s 10-b 76-mW Time-Interleaved SAR ADC in 28 nm CMOS", IEEE Transactions on Circuits and Systems—I: Regular Papers, vol. 64, No. 7, Jul. 2017, pp. 1673-1683.

(Continued)

*Primary Examiner* — Joseph J Lauture
(74) *Attorney, Agent, or Firm* — Seyfarth Shaw LLP/QUALCOMM Incorporated

(57) ABSTRACT

A receiver may include a time-interleaved charge sampler comprising a charge sampler switch in series with a charge sampler capacitor. The receiver may also include a current buffer configured to drive the time-interleaved charge sampler.

18 Claims, 11 Drawing Sheets

(56) References Cited

U.S. PATENT DOCUMENTS

2011/0199122 A1* 8/2011 Morishita ............ H03H 15/023
327/2
2011/0267212 A1* 11/2011 Denison ................... G01D 5/24
341/122

OTHER PUBLICATIONS

Lee H., et al., "A 6-bit 2.5-GS/s Time-Interleaved Analog-to-Digital Converter Using Resistor-Array Sharing Digital-to-Analog Converter", IEEE Transactions on Very Large Scale Integration (VLSI) Systems, vol. 23, No. 11, Nov. 2015, pp. 2371-2383.
International Search Report and Written Opinion—PCT/US2019/027964—ISA/EPO—dated Jul. 16, 2019.
Juha Y-K., et al., "Multirate Charge-Domain Filter Design for RF-Sampling Multi-Standard Receiver", IEEE Transactions on Circuits and Systems I: Regular Papers, IEEE, US, vol. 62, No. 2, Feb. 1, 2015 (Feb. 1, 2015), pp. 590-599, XP011571618, ISSN: 1549-8328, DOI:10.1109/TCSI.2014.2363514, [retrieved on Jan. 26, 2015], sections I-V; figures 1,2.
Karvonen S., et al., "A CMOS Quadrature Charge-Domain Sampling Circuit With 66-dB SFDR Up to 100 MHz", IEEE Transactions on Circuits and Systems Part I: Regular Papers, IEEE Service Center, New York, NY, US, vol. 52, No. 2, Feb. 1, 2005 (Feb. 1, 2005), pp. 292-304, XP011126898, ISSN: 1057-7122, DOI:10.1109/TCSI.2004.841572, section I, II; figures 1-10.

* cited by examiner

TIME-INTERLEAVED CHARGE SAMPLER RECEIVER

BACKGROUND

Field

The present disclosure relates generally to radio frequency (RF) receivers and, more specifically, to a time-interleaved charge sampler receiver.

Background

A wireless device (e.g., a cellular phone or a smartphone) in a wireless communication system may transmit and receive data for two-way communication. The wireless device may include a transmitter for transmitting data and a receiver for receiving data. For transmitting data, the transmitter modulates a radio frequency (RF) carrier signal with data for obtaining a modulated RF signal, amplifies the modulated RF signal for obtaining an amplified RF signal having the proper output power level, and transmits the amplified RF signal via an antenna to a base station.

In a receive path, an antenna receives communication signals and provides a received radio frequency (RF) signal, which is routed through a duplexer/switch and provided to a low noise amplifier (LNA). The received RF signal is amplified by the LNA and filtered by a filter for obtaining a desired RF input signal. Downconversion mixers mix the output of the filter with in-phase (I) and quadrature (Q) receive (RX) local oscillator (LO) signals from an RX LO signal generator for generating in-phase (I) and quadrature (Q) baseband signals. The in-phase (I) and quadrature (Q) baseband signals are amplified by baseband amplifiers and further filtered by baseband filters for obtaining in-phase (I) and quadrature (Q) analog input signals. Analog-to-digital converters (ADCs) are used for converting the analog input signals into digital signals for further processing by a data processor.

Baseband filter as well as anti-aliasing filter design for supporting analog-to-digital conversion in future communication systems is complicated. For example, analog-to-digital conversion in fifth generation (5G) communication systems is complicated by 5G millimeter wave (mmW) baseband signals. In particular, implementing baseband filters and/or anti-aliasing for analog-to-digital conversion in 5G receivers involves higher order filters and buffers that consume significant area as well as significant power. New architectures are desired to eliminate power-hungry buffers, while simultaneously providing anti-alias filtering.

SUMMARY

A receiver is described. The receiver may include a time-interleaved charge sampler. The time-interleaved charge sampler may include a charge sampler switch in series with a charge sampler capacitor. The receiver may also include a current buffer configured to drive the time-interleaved charge sampler.

A method of using a time-interleaved charge sampler is described. The method may include sampling a current-mode input signal at a charge sampler switch to integrate an analog value of the current-mode input signal in a charge sampler capacitor. The method may also include quantizing the analog value integrated in the charge sampler capacitor. The method may further include controlling the charge sampler switch and a dump switch to attenuate the current-mode input signal at an aliasing frequency.

A receiver is further described. The receiver may include a time-interleaved charge sampler comprising a charge sampler switch in series with a charge sampler capacitor. The receiver may also include means for driving the time-interleaved charge sampler.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
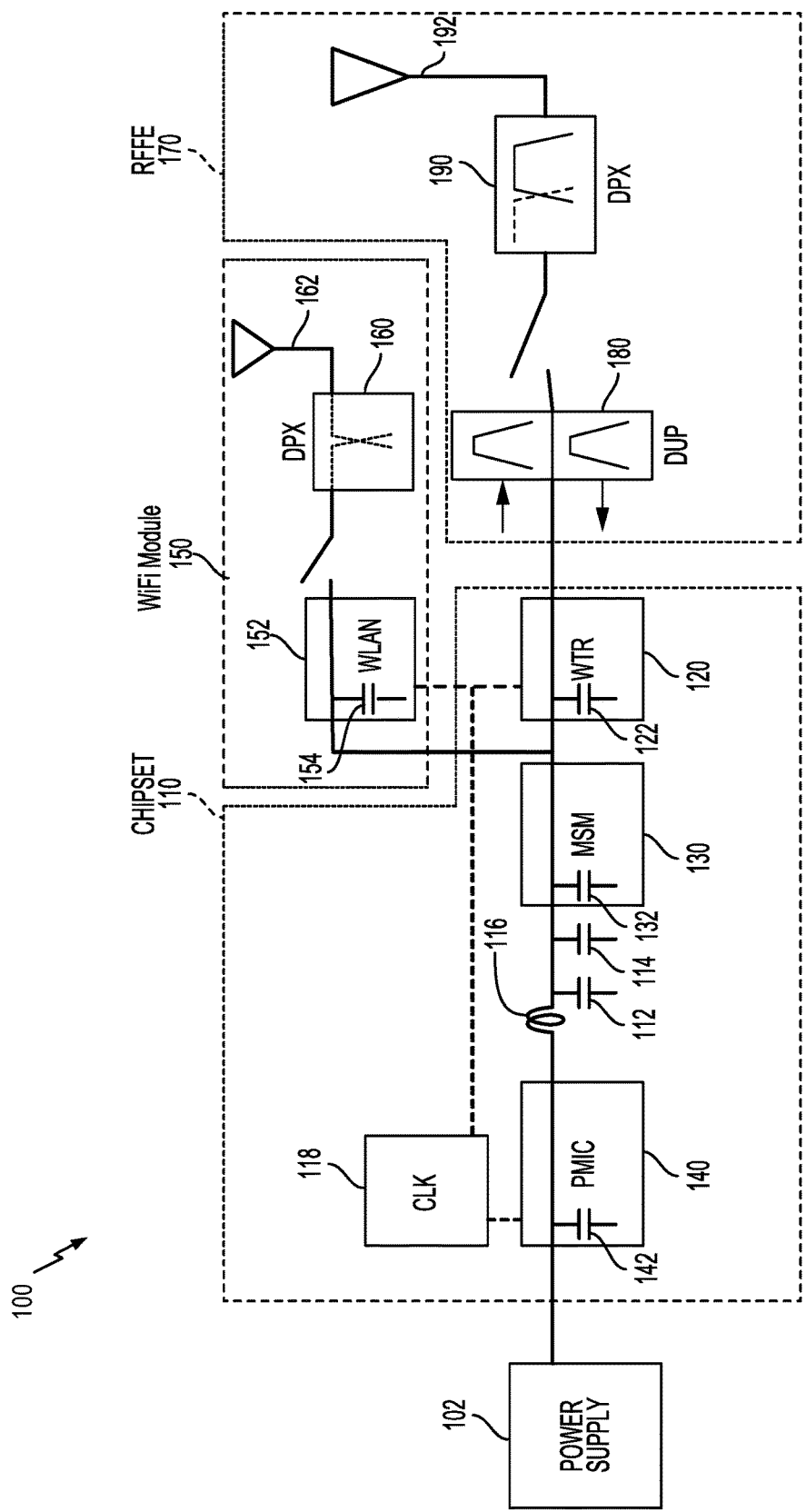
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Fabricating mobile radio frequency (RF) chip designs (e.g., mobile RF transceivers) becomes complex at deep sub-micron process nodes due to cost and power consumption considerations. Further design challenges for mobile RF transceivers include analog/RF performance considerations, including mismatch, noise and other performance considerations. The design complexity of these mobile RF transceivers is further complicated by added circuit functions for supporting communication enhancements.

A wireless device (e.g., a cellular phone or a smartphone) in a wireless communication system may include a mobile RF transceiver for transmitting and receiving data for two-way communication. The mobile RF transceiver may include a transmit section for transmitting data and a receive section for receiving data. For data transmission, the transmit section modulates an RF carrier signal with data for obtaining a modulated RF signal, amplifies the modulated RF signal for obtaining an amplified RF signal having the proper output power level, and transmits the amplified RF signal via an antenna to a base station. For data reception, the receive section obtains a received RF signal via the antenna for amplifying and processing the received RF signal to recover data sent by the base station.

In a receive path, an antenna receives communication signals and provides a received radio frequency (RF) signal, which is routed through a duplexer/switch and provided to a low noise amplifier (LNA). The received RF signal is amplified by the LNA and filtered by a filter to obtain a desired RF input signal. Downconversion mixers mix the output of the filter with in-phase (I) and quadrature (Q) receive (RX) local oscillator (LO) signals from an RX LO signal generator for generating in-phase (I) and quadrature (Q) baseband signals. The in-phase (I) and quadrature (Q) baseband signals are amplified by baseband amplifiers and further filtered by baseband filters for obtaining in-phase (I) and quadrature (Q) analog input signals. Analog-to-digital-converters (ADCs) are used for converting the analog input signals into digital signals for further processing by a data processor.

High throughput/low latency receivers for fifth generation (5G) communication specify large bandwidth and high sample rate analog-to-digital converters (ADCs), such as time-interleaved ADCs. A time-interleaved ADC converter architecture increases the effective conversion rate of an ADC by multiplexing several ADC channels in parallel. In a time-interleaved structure, the effective sampling rate can be increased by N times, by having N time-interleaved channels. Reducing an ADC sampling rate and power consumption involves using low oversampling ratios, which places very difficult constraints on a baseband filter of a 5G receiver. For example, a voltage-mode baseband filter and time-interleaved ADC configuration may be used. Unfortunately, timing specifications dictate high-speed buffers with significant power consumption if the noted voltage-mode baseband filter and time-interleaved ADC configuration is used.

Baseband filter as well as anti-aliasing filter design for supporting analog-to-digital conversion in future communication systems is complicated. For example, supporting fifth generation (5G) millimeter wave (mmW) baseband signals further complicates baseband filter as well as anti-aliasing filter design for analog-to-digital conversion. In particular, implementing baseband filters and/or anti-aliasing for analog-to-digital conversion in 5G receivers involves higher order filters and buffers that consume significant area as well as significant power. For example, using an oversampling ratio (OSR) of two times (2×) a radio frequency (RF) bandwidth (BW), dictates using greater than a fourth (4th) order baseband/anti-aliasing filter. Unfortunately, active filters incur a power consumption/noise/linearity/area penalty for each filter order, which is especially problematic for a fifth (5th) order baseband/anti-aliasing filter. Moreover, there is a desire for the baseband/anti-aliasing filer to scale from fifty (50) megahertz (MHz) to one (1) gigahertz (GHz) for covering the 5G spectrum. Accordingly, new architectures beyond 5G communication systems are desired for eliminating power-hungry buffers, while simultaneously providing anti-alias filtering. Reference to 5G communication systems is provided to facilitate explanation. It should be recognized, however, that other communication systems are contemplated according to aspects of the present disclosure.

According to aspects of the present disclosure, a time-interleaved current-mode charge sampler is proposed for reducing power consumption and providing scalability in a filtering response. This proposed architecture eliminates power-hungry voltage-mode buffers and voltage-mode anti-aliasing filters due to an inherent filtering response of the time-interleaved charge sampler at aliasing frequencies. In this aspect of the present disclosure, the time-interleaved current-mode charge sampler uses current-mode filters to: (1) lower power consumption, (2) reduce area consumption, and (3) provide inherent anti-alias filtering that scales with a sample rate. Additionally, baseband filter constraints are relaxed due to the current-mode implementation. Benefits of the relaxed filter constraints include reducing a power/area/complexity of the time-interleaved current-mode charge sampler.

FIG. 1 is a schematic diagram of a wireless device 100 (e.g., a cellular phone or a smartphone), having a time-interleaved charge sampler with inherent anti-aliasing for a 5G receiver module and a receiver analog-to-digital converter (ADC), according to aspects of the present disclosure. Although described with reference to 5G communication systems to facilitate explanation, it should be recognized that other communication systems are contemplated according to aspects of the present disclosure. The wireless device may include a wireless local area network (WLAN) (e.g., WiFi) module 150 and an RF front end module 170 for a chipset 110. The WiFi module 150 includes a first diplexer 160 communicably coupling an antenna 162 to a wireless local area network module (e.g., WLAN module 152). The RF front end module 170 includes a second diplexer 190 communicably coupling an antenna 192 to the wireless transceiver (WTR) 120 through a duplexer 180 (DUP).

In this configuration, the wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 between the PMIC 140 and the modem 130. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

Figure 2:
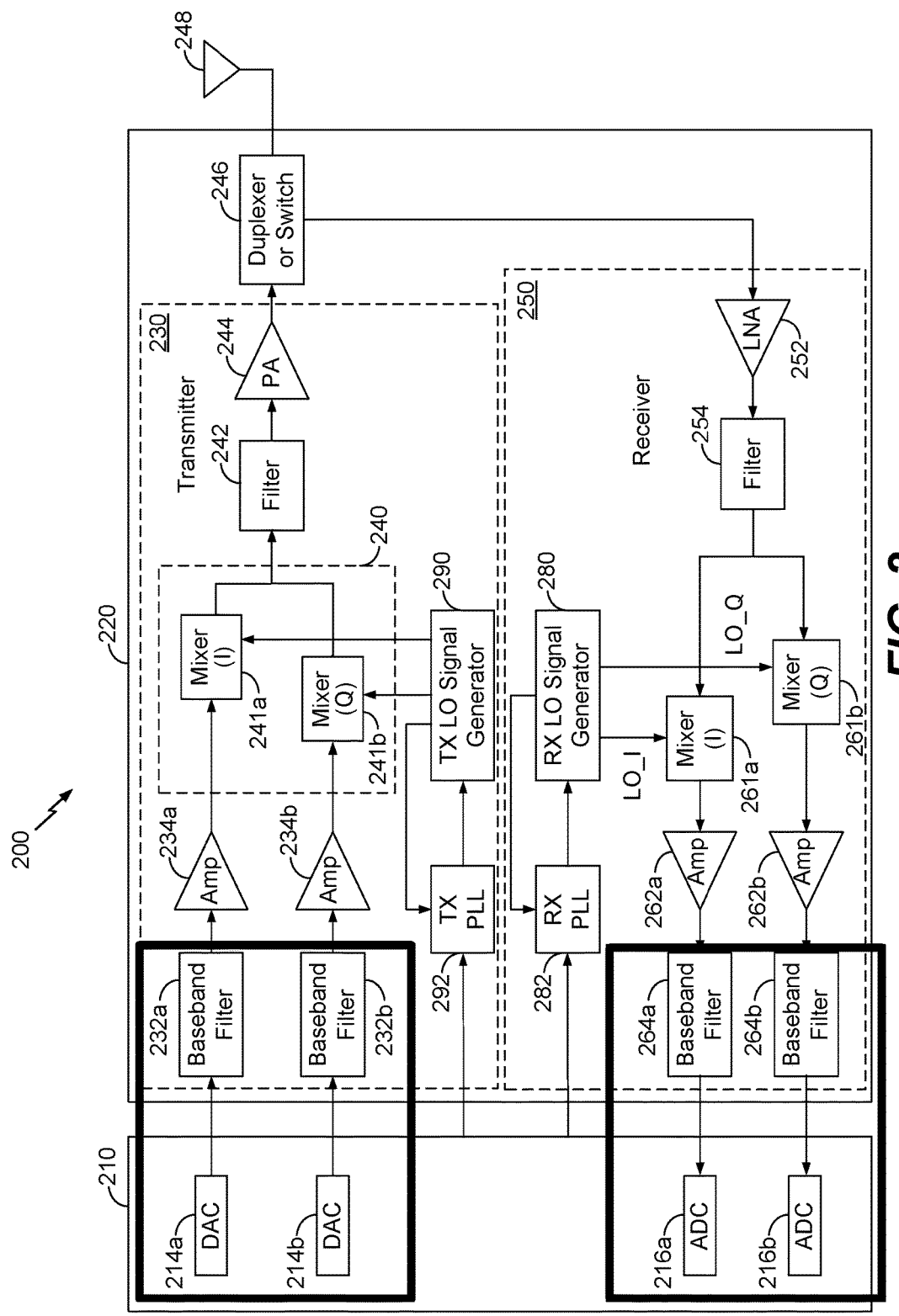
FIG. 2 shows a block diagram of the wireless device shown in FIG. 1.

FIG. 2 shows a block diagram of an exemplary design of a wireless device 200, including a time-interleaved charge sampler with inherent anti-aliasing for a 5G receiver module and a receiver analog-to-digital converter (ADC), such as the wireless device 100 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing. The DACs 214a and 214b, as well as analog-to-digital converters (ADCs) 216a and 216b, may be integrated with the transceiver 220.

Within the transmitter 230, baseband filters 232a and 232b filter the in-phase (I) and quadrature (Q) analog transmit signals, respectively, to remove undesired images caused by the prior digital-to-analog conversion. Amplifiers (Amp) 234a and 234b amplify the signals from baseband filters 232a and 232b, respectively, and provide in-phase (I) and quadrature (Q) baseband signals. Upconverters 240 include an in-phase upconverter 241a and a quadrature upconverter 241b that upconverter the in-phase (I) and quadrature (Q) baseband signals with in-phase (I) and quadrature (Q) transmit (TX) local oscillator (LO) signals from a TX LO signal generator 290 to provide upconverted signals. A filter 242 filters the upconverted signals to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. A duplexer component of the duplexer/switch 246 is designed to operate with a specific receive (RX) to transmit (TX) (RX-to-TX) duplexer frequency separation, such that RX signals are isolated from TX signals. A switch component of the duplexer/switch 246 may be used for a time division duplex (TDD) mode, where there is no frequency separation between RX and TX. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by baseband filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless devices of FIGS. 1 and 2 operate in a wireless communication system that transmits and receives data for two-way communication. The wireless communication system may include a number of base stations that can support communication for the wireless devices of FIGS. 1 and 2. The wireless devices may communicate with a base station via a downlink and an uplink. The downlink (or forward link) refers to the communication link from the base station to the wireless devices, and the uplink (or reverse link) refers to the communication link from the wireless devices to the base station. A base station may transmit data and control information on the downlink to the wireless devices and/or may receive data and control information on the uplink from the wireless devices.

In this process, the data signals communicated may be converted from an analog signal to a digital signal. For example, the analog-to-digital converters (ADCs) 216a and 216b are used for converting analog input signals into digital signals for further processing by the data processor 210. For example, the ADCs 216a and 216b may convert received radio frequency (RF) signals that are down-converted to baseband signals, filtered, and otherwise processed into digital signals for further signal processing by the data processor 210 in the digital domain. Analog-to-digital converters, however, may involve some reconfiguration for supporting fifth generation (5G) communication systems, or other like future communication systems.

For example, high throughput/low latency receivers (e.g., receiver 250) for 5G communication specify a large bandwidth and a high sample rate for analog-to-digital converters, such as time-interleaved ADCs. Reducing an ADC sampling rate and power consumption involves using low oversampling ratios, which places very difficult constraints on a baseband filter of a 5G receiver. For example, a voltage-mode baseband filter and time-interleaved ADC configuration may be used. Unfortunately, timing specifications dictate high-speed buffers that consume significant amounts of power when used in conjunction with a voltage-mode baseband filter in a time-interleaved ADC configuration.

Supporting 5G millimeter wave (mmW) baseband signals further complicates baseband filter as well as anti-aliasing filter design for analog-to-digital conversion. In particular, implementing baseband filters and/or anti-aliasing for analog-to-digital conversion in 5G receivers involves higher order filters and buffers that consume significant area as well as significant power. For example, an oversampling ratio (OSR) of two times (2×) a radio frequency (RF) bandwidth (BW) may involve using a fifth (5th) order baseband/anti-aliasing filter. The fifth order baseband/anti-aliasing filter unfortunately incurs a power consumption/noise/linearity/area penalty for each filter order. Accordingly, new architectures are desired for supporting the 5G spectrum, while eliminating power-hungry buffers and simultaneously providing anti-alias filtering.

According to aspects of the present disclosure, a time-interleaved current-mode charge sampler is proposed for reducing power consumption and providing scalability in a filtering response. In an alternative configuration, a current steering digital-to-analog converter (DAC) of a low-power 5G transmitter is described, providing benefits, such as a filter response for supporting inherent anti-aliasing. These proposed architectures eliminate power-hungry voltage-mode buffers and voltage-mode anti-aliasing filters. In this aspect of the present disclosure, the time-interleaved current-mode charge sampler uses current-mode filters to: (1) lower power consumption, (2) reduce area consumption, and (3) provide inherent anti-alias filtering that scales with a sample rate. Additionally, baseband filter constraints can be relaxed due to a current-mode implementation, leading to further reductions in power/area/complexity of a time-interleaved current-mode charge sampler, for example, as shown in FIG. 3.

Figure 3:
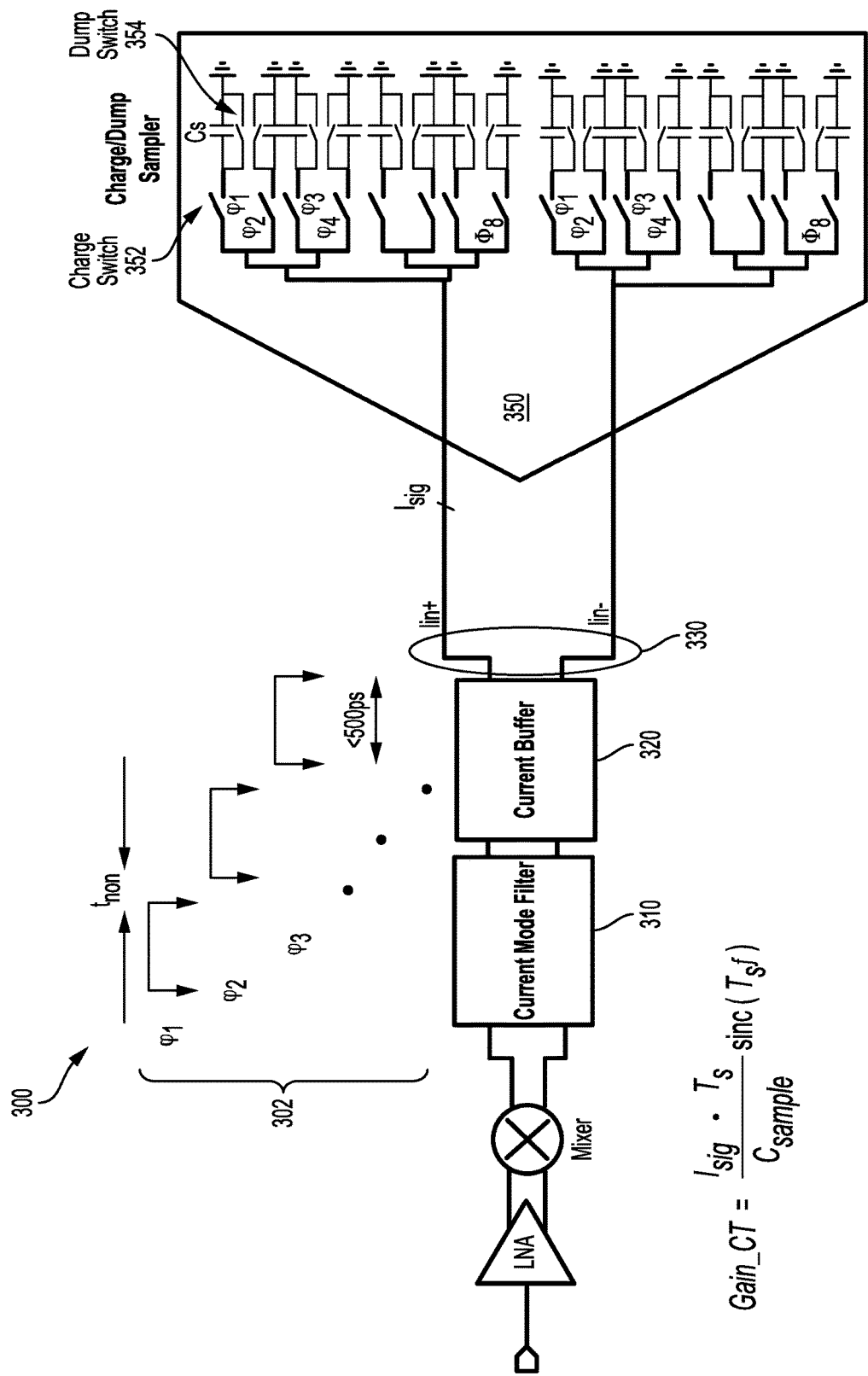
FIG. 3 illustrates a block diagram of a time-interleaved charge sampler with inherent anti-aliasing for a 5G receiver module and a receiver analog-to-digital converter (ADC), according to aspects of the present disclosure.

FIG. 3 illustrates a block diagram of a time-interleaved charge sampler with inherent anti-aliasing for a 5G receiver module and a receiver analog-to-digital converter (ADC), according to aspects of the present disclosure. In this current-mode configuration, a receiver module 300 includes a low noise amplifier (LNA) that amplifies a received radio frequency (RF) signal to feed a mixer. The low noise amplifier may be a differential low noise amplifier. The mixer may generate in-phase (I) and quadrature (Q) components that are fed to a current-mode filter 310 (e.g., a lowpass filter) and a current buffer 320. The current buffer 320 may replace a transimpedance amplifier as well as an anti-aliasing filter of conventional voltage-mode samplers.

The current buffer 320 may operate as a current mirror, configured for outputting differential input current signals (Iin+, Iin−) for differential inputs 330 of a time-interleaved charge/dump sampler 350. The time-interleaved charge/dump sampler 350 includes a first differential input path (Iin+) and a second differential input path (Iin−). The time-interleaved charge/dump sampler 350 may operate according to a windowed integration using clock pulse signals 302 operating at an aliasing frequency due to an inherent filtering response of the time-interleaved charge/dump sampler 350. In this example, a two (2) giga-sample (GS) analog-to-digital conversion process uses a predetermined integration widow (e.g., <500 picoseconds (ps)), as defined by rising/falling edges of the clock pulse signals 302. The clock pulse signals 302 are non-overlapping, as shown by a non-overlapping period ($t_{non}$).

According to aspects of the present disclosure, the time-interleaved charge/dump sampler 350 is configured as a charge/dump sampler, including a charge switch 352 and a dump switch 354. In this example, the charge switch 352 and the dump switch 354 operate according to phases (e.g., $\Phi_1$, $\Phi_2$, ..., $\Phi_8$) and corresponding dump signals (e.g., $D_1$, $D_2$, ..., $D_8$). For example, each charge switch 352 enables integrating the input differential current signals (Iin+, Iin−) on a sampling capacitor Cs during an integration window according to this eight-phase example. Once each sample capacitor Cs has stored the sample charge and quantization is complete for that sample, the dump switch 354 is closed in response to a dump signal for clearing the sampling capacitor Cs prior to the start of the next integration window, for example, as shown in FIGS. 4A and 4B.

Figure 4A:
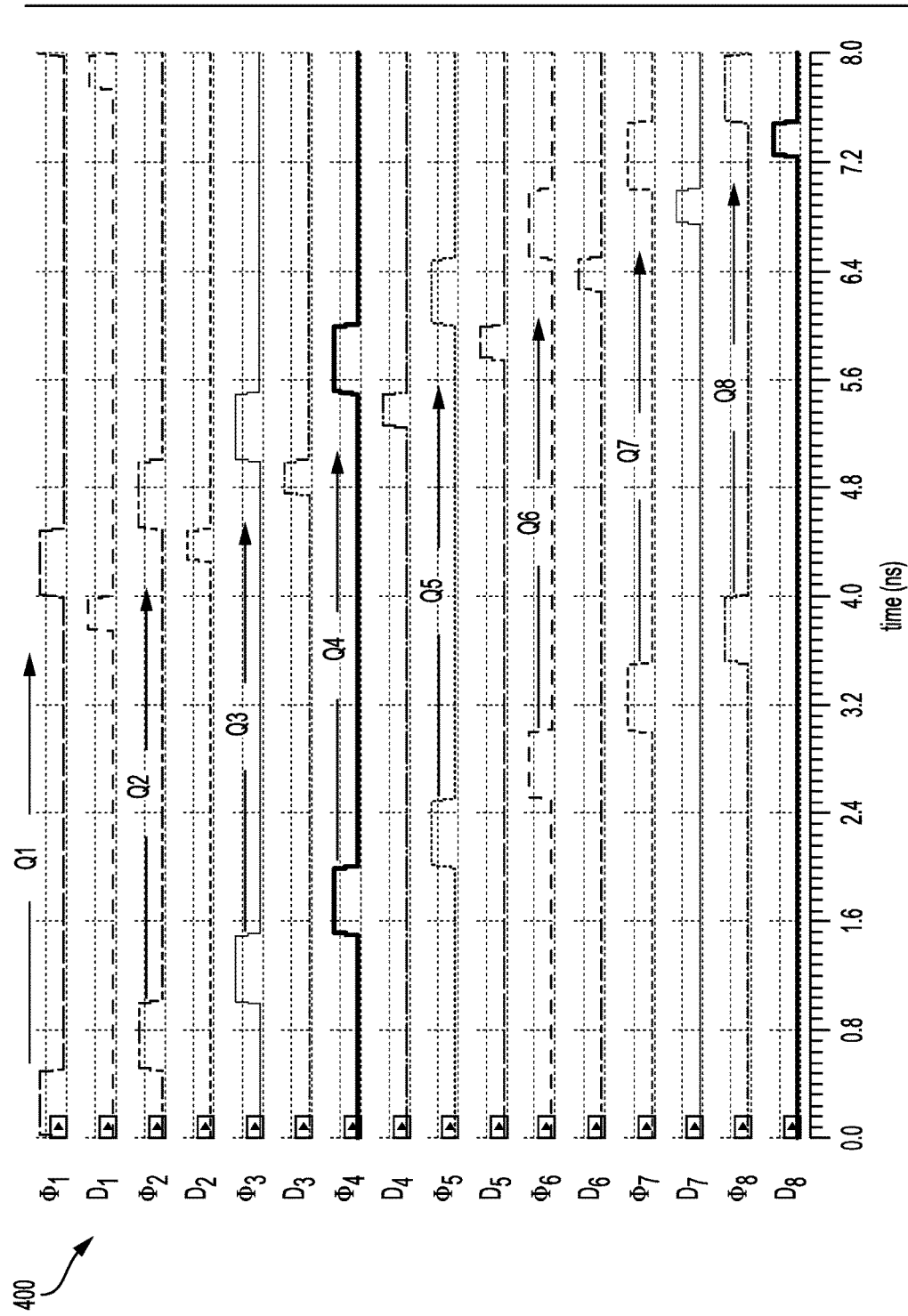
FIGS. 4A and 4B illustrate operation of the time-interleaved charge sampler according to an eight-phase configuration shown in FIG. 3, according to aspects of the present disclosure.
Figure 4B:
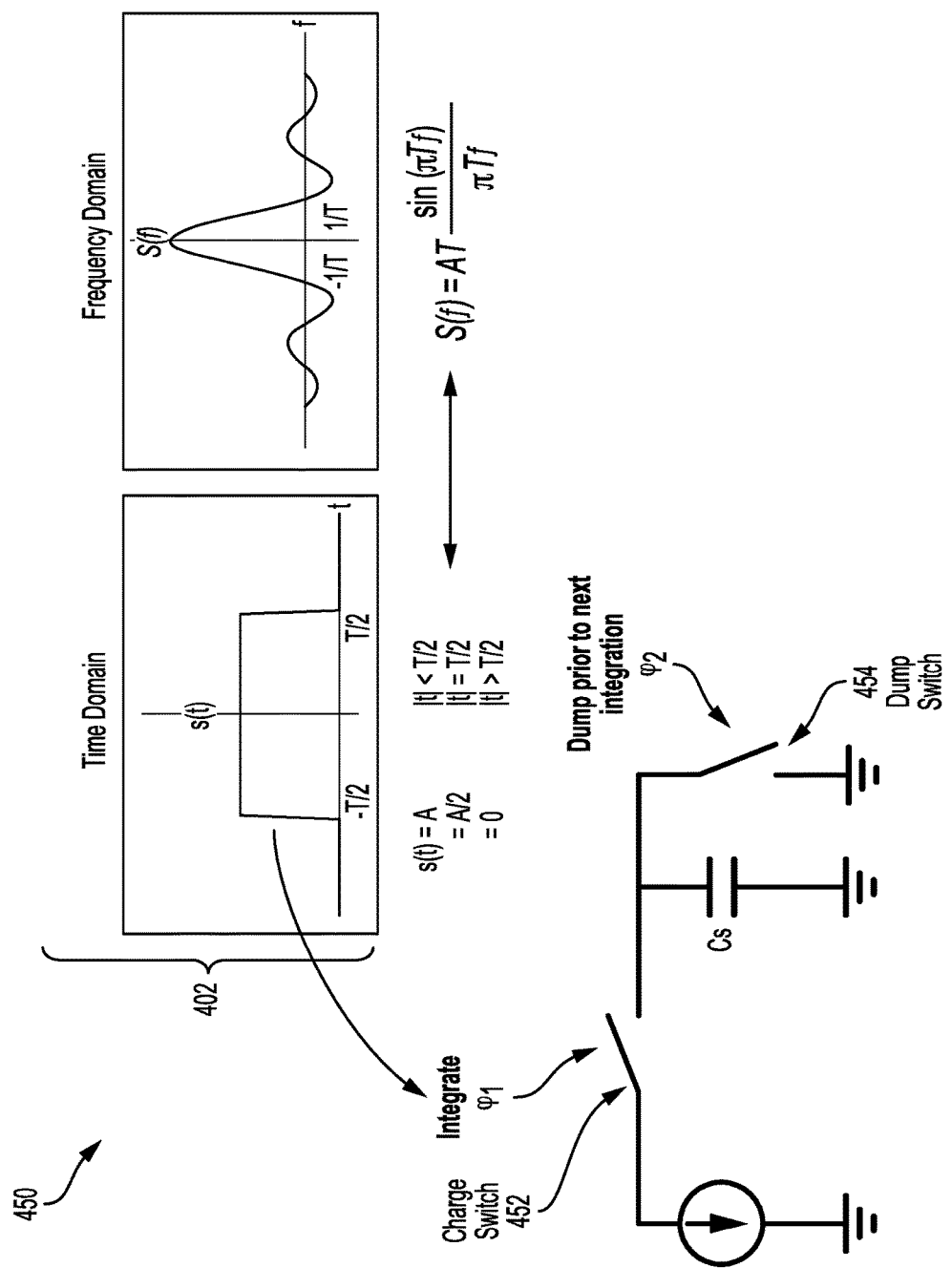

FIGS. 4A and 4B illustrate operation of the time-interleaved charge/dump sampler 350 according to the eight-phase configuration shown in FIG. 3. FIG. 4A illustrates a timing diagram 400 for an eight-phase windowed integration, according to aspects of the present disclosure. FIG. 4B illustrates a portion 450 of the time-interleaved charge/dump sampler 350 of FIG. 3. A clock pulse signal 402 for a first clock phase $\Phi_1$, is shown in a time domain and a frequency domain. In this example, a rising edge of the clock pulse signal 402 closes a charge switch 452 to load a differential input current in the sampling capacitor Cs. The sampling capacitor Cs may be a successive approximation register (SAR) capacitor of a quantizer or an analog-to-digital converter. A falling edge of the clock pulse signal 402 terminates integration and initiates a second clock phase $\Phi_2$, for a next input signal integration after the non-overlapping period $t_{non}$.

In FIG. 4A, quantization periods (e.g., Q1, Q2, ..., Q8) are shown, in which an analog value stored in the sampling capacitor Cs is converted into a digital value. For example, a first quantization period Q1 is initiated by a falling edge of the first clock phase $\Phi_1$, which also terminates an integration window for storing charge in the sampling capacitor Cs. In addition, the first quantization period Q1 is terminated by a rising edge of a first dump signal D1, in which the analog value stored in the sampling capacitor Cs is cleared in preparation for a next integration cycle. In this example, integrating the differential input current (Iin+, Iin−) is performed one channel at a time, for each of the phases (e.g., $\Phi_1, \Phi_2, \ldots, \Phi_8$), which provides an inherent anti-aliasing filtering response.

As shown in FIG. 4B, the rectangular integration window of the clock pulse signal 402, as shown in the time domain results in a sinc function in the frequency domain of the clock pulse signal 402. In addition, nulls are shown in the frequency domain, as dictated by the repetition period $T_s$ of the rectangular signal in the time domain (rect(t)). This filter response behavior is a benefit of using window integration, in which a continuous-time signal gain is computed as follows:

$$\text{Gain\_CT} = \frac{I_{sig} \cdot T_s}{C_{sample}} \text{sinc}(T_s f) \quad (1)$$

where $I_{sig}$ in an input current signal, $T_s$ is an inverse of the sampling frequency (Fs), and $C_{sample}$ is the sampling capacitor Cs. This gain provides nulls at the sampling frequency Fs (e.g., 2 GHz), which supports a predetermined rejection value (e.g., greater than 40 decibels (dB)).

The charge stored in the sampling capacitor Cs may be provided to a successive approximation register (SAR) analog-to-digital converter (ADC). A SAR ADC is widely used in various applications that specify low power and area efficient ADCs. Alternatively, the charge stored in the sampling capacitor is provided to a quantizer, which receives the results of the time-interleaved charge/dump sampler 350 for completing the ADC conversion of the analog value stored in the sampling capacitor Cs into a digital domain.

Figure 5:
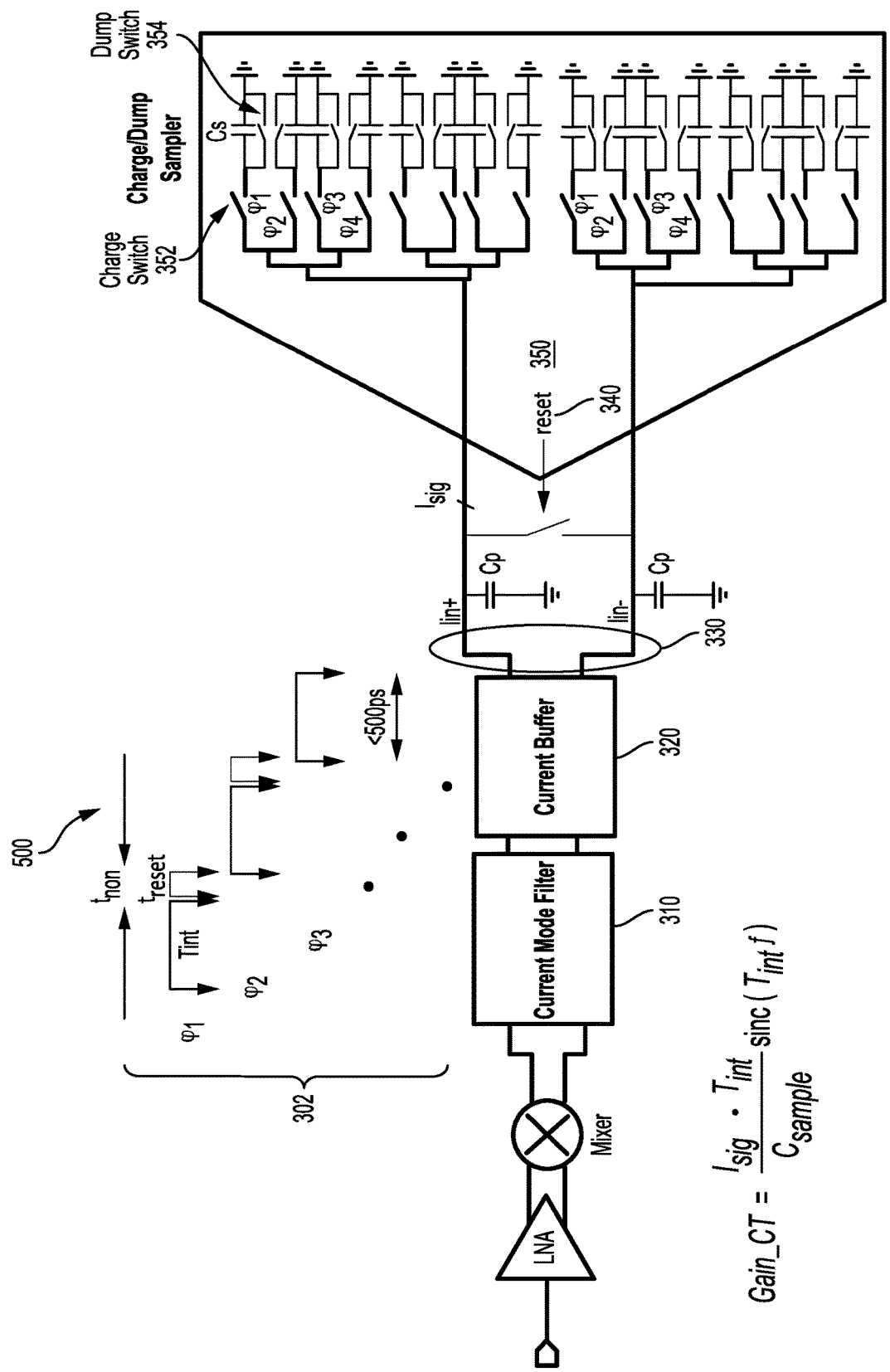
FIG. 5 illustrates a block diagram of a time-interleaved charge sampler with inherent anti-aliasing for a 5G receiver module and a receiver analog-to-digital converter (ADC), according to further aspects of the present disclosure.

FIG. 5 illustrates a block diagram of a time-interleaved charge sampler for a 5G receiver module and a receiver analog-to-digital converter (ADC), according to further aspects of the present disclosure. This aspect addresses narrow gaps allocated for reset in the configuration of FIG. 3. This current-mode configuration of a receiver module 500 is similar to the configuration shown in FIG. 3, including an LNA that amplifies a received RF signal to feed a mixer. The mixer may generate in-phase (I) and quadrature (Q) components that are fed to the current-mode filter 310 and the current buffer 320. The current buffer 320 also outputs differential input current signals (Iin+, Iin−) for the differential inputs 330 of the time-interleaved charge/dump sampler 350. Unfortunately, the differential inputs 330 of the time-interleaved charge/dump sampler 350 may be high impedance during the non-overlapping period $t_{non}$ of the clock pulse signals 302, which causes overshoot and/or undesirable voltage swings.

In this configuration, an input reset switch 340 is coupled between the differential inputs 330 of the time-interleaved charge/dump sampler 350. The input reset switch 340 is provided for mitigating overshoot and/or limiting voltage swings during the non-overlapping period $t_{non}$, by absorbing current generated during this period. In this example, the input reset switch 340 is closed by a rising edge of a reset period signal $t_{reset}$ and opened by the falling edge of the reset period signal $t_{reset}$. Opening and closing of the input reset switch 340 may significantly reduce an infinite impulse response (IIR) lowpass filter effect caused by parasitic capacitance Cp at the differential inputs 330 of the time-interleaved charge/dump sampler 350, such as droop. The parasitic capacitance Cp may be caused by the current mirror operation of the current buffer 320.

Unfortunately, using the input reset switch 340 for eliminating the IIR lowpass filter and droop caused by parasitic capacitance Cp may increase power consumption when an integration period Tint is less than a sampling period Ts (=1/fs (sampling frequency)). Having the integration period Tint fall below the sampling period Ts may push out nulls from the frequency domain shown in FIG. 4B, so that nulls no longer appear at the sampling frequency Fs (e.g., 2 GHz for Fs=2 giga-samples per second (GS/s)). In this configuration, the input reset switch 340 can be used for higher bandwidth modes (e.g., >800 MHz), whereas low bandwidth modes (e.g., <400 MHz) may rely on the parasitic capacitance Cp. The gain of the receiver module 500 is similar to the gain shown in FIG. 3, in which the sampling period Ts is replaced by the integration period Tint in equation (1).

Figure 6A:
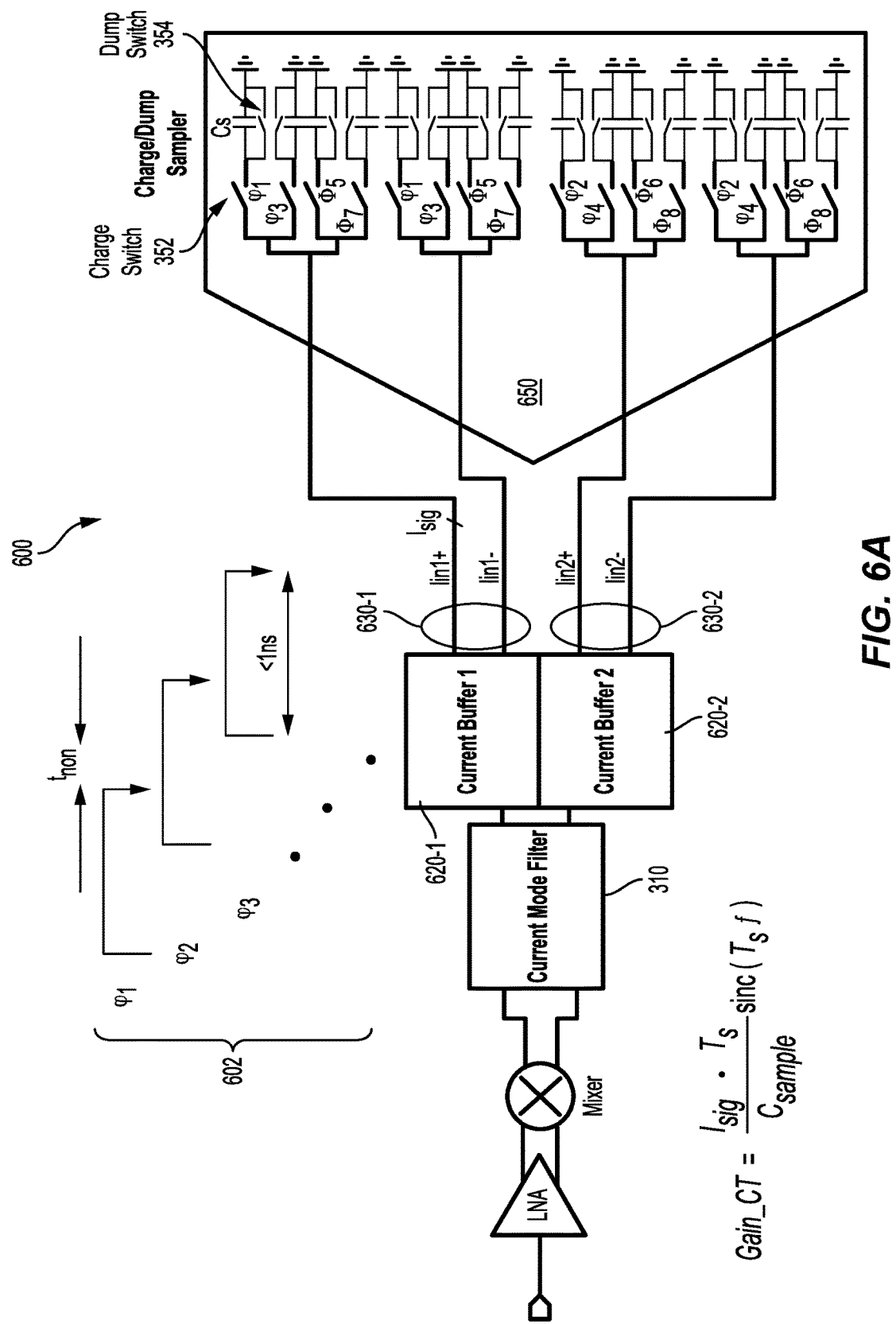
FIGS. 6A and 6B illustrate block diagrams of time-interleaved charge samplers with multiple current buffers for a receiver analog-to-digital converter (ADC), according to further aspects of the present disclosure.
Figure 6B:
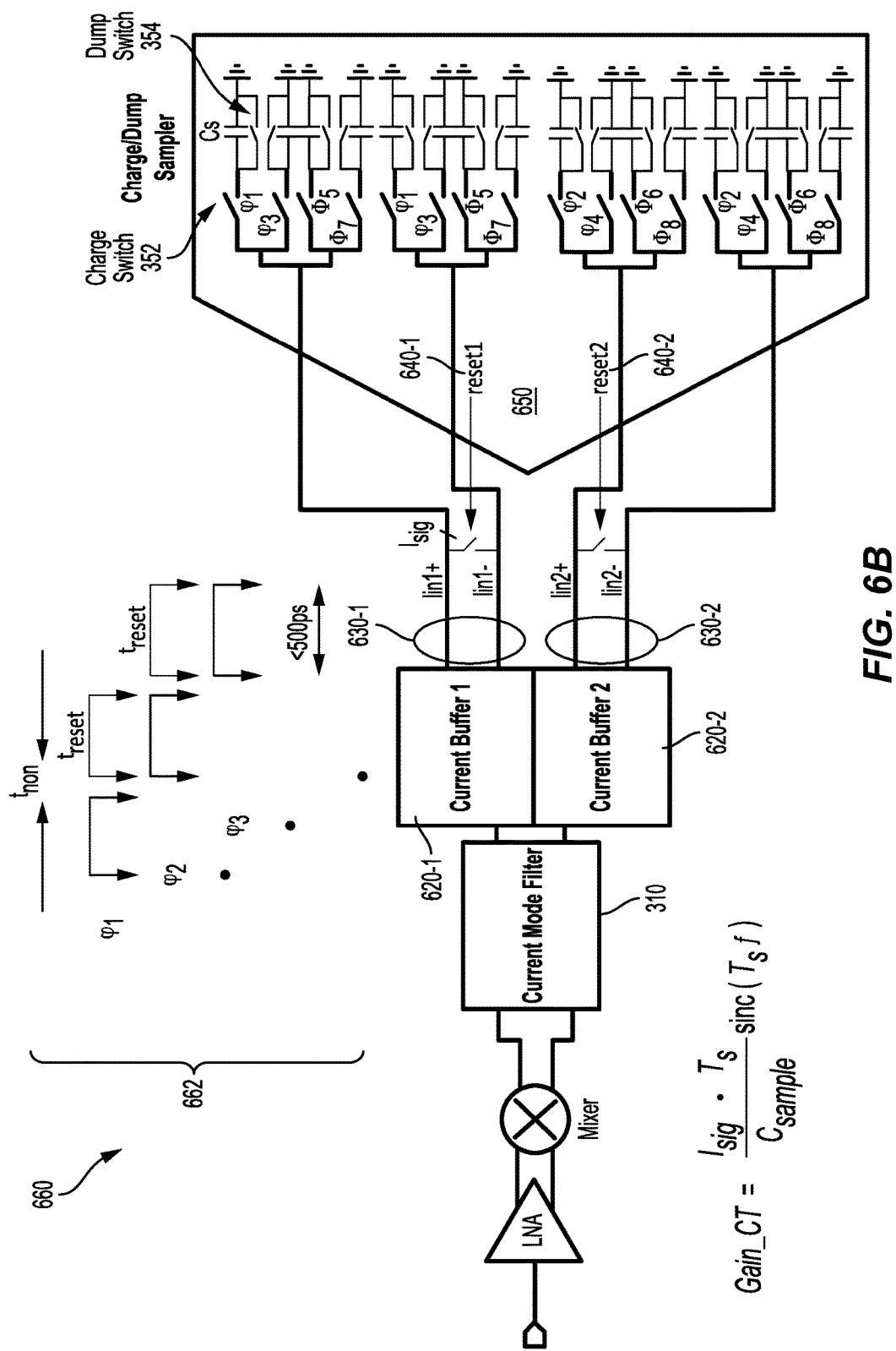

FIGS. 6A and 6B illustrate block diagrams of time-interleaved charge samplers with multiple current buffers for a receiver analog-to-digital converter (ADC), according to further aspects of the present disclosure. As shown in FIG. 6A, this current-mode configuration of a receiver module 600 is similar to the configuration shown in FIG. 3, including an LNA that amplifies a received RF signal to feed a mixer. The mixer may generate in-phase (I) and quadrature (Q) components that are fed to the current-mode filter 310. In this aspect of the present disclosure, the current buffer (e.g., 320 of FIG. 3) is split into a first current buffer 620-1 and a second current buffer 620-2 for scaling current, which maintains a gain of the receiver module 600.

In this configuration, the first current buffer 620-1 outputs first differential input current signals (Iin1+, Iin1−) for first differential inputs 630-1 of a time-interleaved charge/dump sampler 650. In addition, the second current buffer 620-2 outputs second differential input current signals (Iin2+, Iin2−) for second differential inputs 630-2 of the time-interleaved charge/dump sampler 650. In this example, the first differential inputs 630-1 of the time-interleaved charge/dump sampler 650 are for odd phases (e.g., $\Phi_1, \Phi_3, \Phi_5, \Phi_7$) of clock pulse signals 602. Similarly, the second differential inputs 630-2 of the time-interleaved charge/dump sampler 650 are for even phases (e.g., $\Phi_2, \Phi_4, \Phi6_5, \Phi_7$) of clock pulse signals 602.

In this aspect of the present disclosure, an integration time for the clock pulse signals 602 is doubled, relative to the clock pulse signals 302 shown in FIGS. 3 and 5. Doubling the integration time beneficially reduces the frequency of when the non-overlapping period $t_{non}$ occurs. The sampling frequency Fs is the same as the previous configuration (e.g., Fs=2 GS/s), with an increased integration window of approximately 1 nanosecond. This increased integration window moves a null to half of the sampling frequency Fs (e.g., 1 GHz). That is, extending the integration window changes a sampling rate and moves a notch frequency (null) from the sampling frequency to half of the sampling frequency. Doubling of the clock pulse signals 602 also relaxes meeting of bandwidth and clock timing specifications. In addition, power specifications may also be reduced by alternately deactivating the first differential inputs 630-1 or the second differential inputs 630-2 when reducing the sample rate Fs (e.g., by half, for instance). That is, one of the differential input paths to the time-interleaved charge/dump sampler 650 is turned off when the other differential input path is being used.

FIG. 6B illustrates a block diagram of a time-interleaved charge sampler with multiple current buffers for a receiver analog-to-digital converter (ADC), according to further aspects of the present disclosure. This current-mode configuration of a receiver module 660 is similar to the configuration shown in FIG. 6A, including an LNA that amplifies a received RF signal to feed a mixer. The mixer may generate in-phase (I) and quadrature (Q) components that are fed to the current-mode filter 310. In this aspect of the present disclosure, the current buffer (e.g., 320 of FIG. 3) is also split into a first current buffer 620-1 and a second current buffer 620-2.

In this configuration, the first current buffer 620-1 also outputs first differential input current signals (Iin1+, Iin1−) for the first differential inputs 630-1 of the time-interleaved charge/dump sampler 650. In addition, the second current buffer 620-2 also outputs second differential input current signals (Iin2+, Iin2−) for the second differential inputs 630-2 of the time-interleaved charge/dump sampler 650. In this example, the first differential inputs 630-1 of the time-interleaved charge/dump sampler 650 are also for odd phases (e.g., $\Phi_1$, $\Phi_3$, $\Phi_5$, $\Phi_7$) of clock pulse signals 662. Similarly, the second differential inputs 630-2 of the time-interleaved charge/dump sampler 650 are also for even phases (e.g., $\Phi_2$, $\Phi_4$, $\Phi 6_5$, $\Phi_7$) of clock pulse signals 662. This configuration also includes generating clock phases for controlling the charge switch 352 and the dump switch 354, in which the clock phases provide a filter response for quantizing analog values stored in the sampling capacitors (Cs).

In this example, the first differential inputs 630-1 and the second differential inputs 630-2 of the time-interleaved charge/dump sampler 650 may also experience high impedance. In this configuration, a first input reset switch 640-1 is coupled between the first differential inputs 630-1 of the time-interleaved charge/dump sampler 650. In addition, a second input reset switch 640-2 is coupled between the second differential inputs 630-2 of the time-interleaved charge/dump sampler 650. The first input reset switch 640-1 and the second input reset switch 640-2 are provided for mitigating overshoot and/or limiting voltage swings during reset periods.

In this aspect of the present disclosure, an integration time for the clock pulse signals 662 is maintained, relative to the clock pulse signals 302 shown in FIGS. 3 and 5. In this example, a first reset signal $t_{reset1}$ is generated after a first phase $\Phi_1$ of the clock signal and concurrent with a second phase $\Phi_2$ of the clock signal. During the first phase $\Phi_1$ of the clock signal, the first differential input current signals (Iin1+, Iin1−) are integrated into the sampling capacitors Cs associated with the first phase $\Phi_1$ of the clock signal. This integration is performed by closing the charge switch 352 of the associated sampling capacitors Cs in response to a rising edge of the first phase $\Phi_1$ of the clock signal, and opening the charge switch 352 in response to a falling edge of the first phase $\Phi_1$ of the clock signal.

After the non-overlapping clock period $t_{non}$, the first reset signal $t_{reset1}$ is generated concurrently with the second phase $\Phi_2$ of the clock signal. The first reset signal $t_{reset1}$ is generated for shorting the first differential inputs 630-1 by closing the first input reset switch 640-1. Concurrently, the second phase $\Phi_2$ of the clock pulse signals 662 integrates the second differential input current signals (Iin2+, Iin2−) into the sampling capacitor Cs associated with the second phase $\Phi_2$ of the clock pulse signals 662. This process is repeated for the third clock phase $\Phi_3$ of the clock pulse signals 662, in which a second reset signal $t_{reset2}$ is generated for shorting the second differential inputs 630-2 by closing the second input reset switch 640-2.

As shown in FIG. 6B, the sampling frequency Fs is the same as the previous configuration (e.g., Fs=2 GS/s) shown in FIG. 6A, with an integration window of approximately 500 picoseconds. This process uses additional time relative to the doubling of the clock pulse signals 602, as shown in FIG. 6A. Nevertheless, the process shown in FIG. 6B also provides a filter response by using a sampling period Ts (=1/Fs (sampling frequency)) instead of an integration period Tint (see FIG. 5) for computing a gain (see equation (1)). In addition, power specifications may also be reduced by alternately deactivating the first differential inputs 630-1 or the second differential inputs 630-2 while reducing the sample rate Fs (e.g., by half, for instance). That is, one of the differential input paths to the time-interleaved charge/dump sampler 650 is turned off when the other differential input path is used.

For example, the first input reset switch 640-1 and/or the second input reset switch 640-2 are closed for absorbing current generated during a first reset period ($t_{reset1}$) or a second reset period ($t_{reset2}$), respectively, for preventing overshoot and voltage swings. In operation, the first input reset switch 640-1 is closed by a rising edge of the first reset period signal $t_{reset1}$ and opened by the falling edge of the first reset period signal $t_{reset1}$. In addition, the second input reset switch 640-2 is closed by a rising edge of a second reset period signal $t_{reset2}$. As in FIG. 5, the reset switch may eliminate the IIR lowpass filter response from parasitic capacitor Cp. This configuration supports a higher bandwidth sampling than the configurations shown in FIGS. 3 and 6A.

Figure 7:
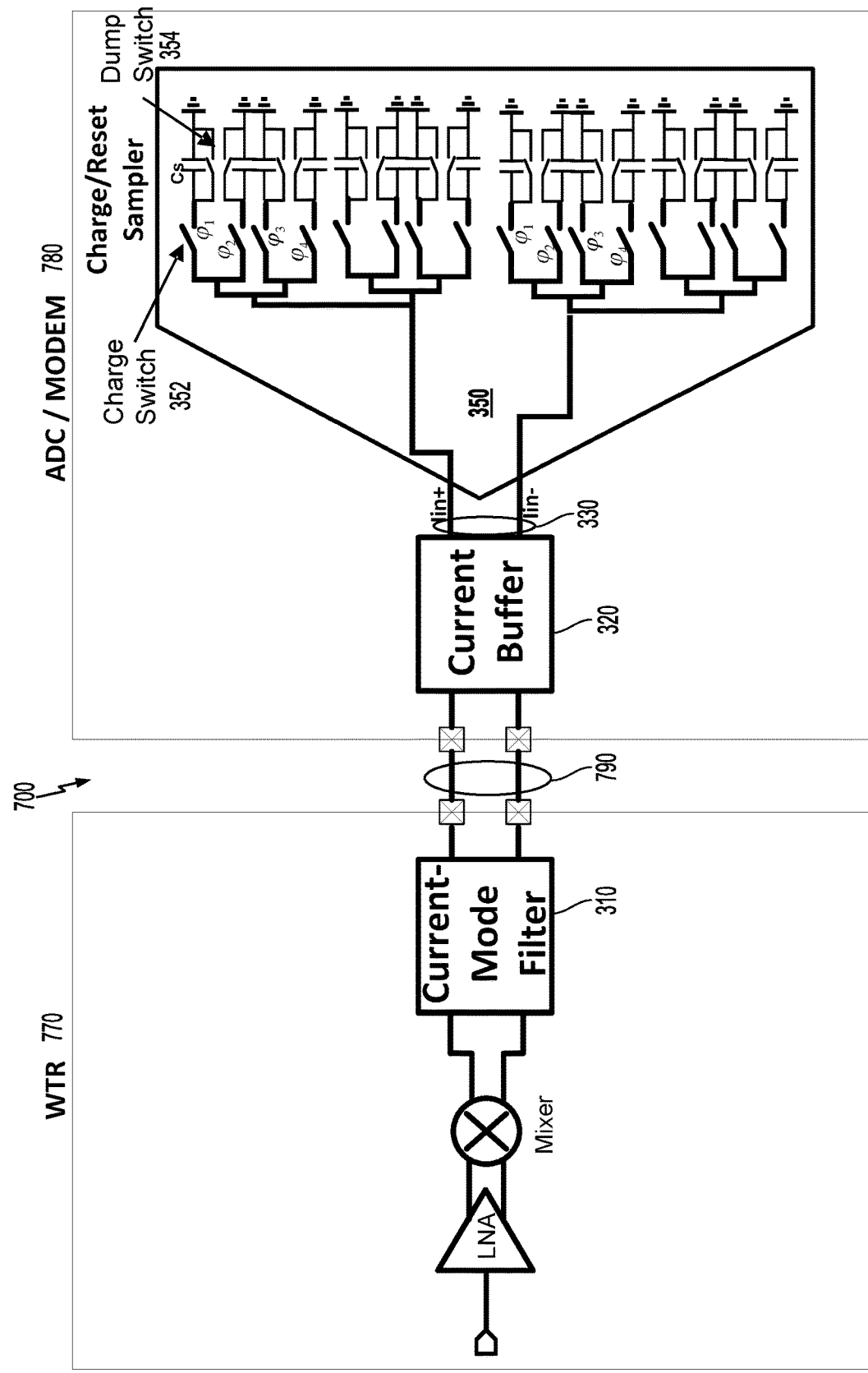
FIG. 7 illustrates a schematic diagram in which the receiver module is split for integration using a system-in-package (SIP) link, according to aspects of the present disclosure.

FIG. 7 illustrates a schematic diagram 700, in which the receiver module 300 (of FIG. 3) is split for integrating into separate chips coupled by a system-in-package (SIP) link, according to aspects of the present disclosure. Representatively, the differential low noise amplifier (LNA), the mixer, and the current-mode filter 310 are integrated on a wireless transceiver (WTR) chip 770, such as the WTR 120 shown in FIG. 1. In addition, the current buffer 320 and the time-interleaved charge/dump sampler 350 are integrated on an analog-to-digital converter (ADC)/MODEM chip 780, such as the modem 130 (e.g., a baseband modem) shown in FIG. 1. In this configuration, the ADC chip 780 is coupled to the WTR chip 770 by a system-in-package (SIP) link 790. Although described regarding the receiver module 300 of FIG. 3, the receiver modules described in FIGS. 5, 6A, and 6B may be split, as shown in FIG. 7. In addition, the disclosure may be applied for transmitting instead of receiving, for example, if a current-mode digital to analog converter is employed.

Figure 8:
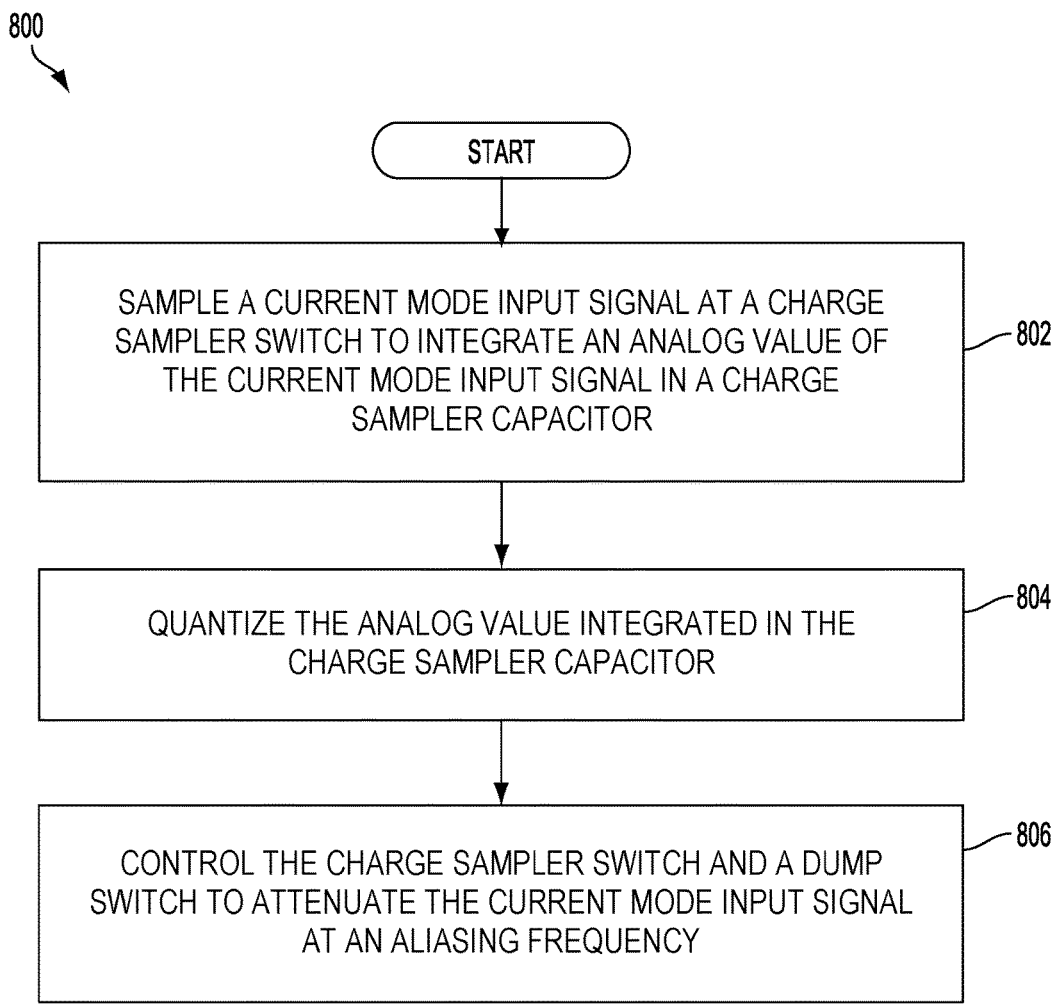
FIG. 8 is a flow diagram illustrating a method of time-interleaved charge sampling, according to aspects of the present disclosure.

FIG. 8 is a process flow diagram illustrating a method of using a time-interleaved charge sampler, according to an aspect of the present disclosure. A method 800 begins at block 802, in which a current-mode input signal is sampled at a charge sampler switch to integrate an analog value of the current-mode input signal in a charge sampler capacitor. For example, as shown in FIG. 3, the charge switch 352 of the time-interleaved charge/dump sampler 350 samples one of the clock pulse signals 302 to detect an associated clock phase (e.g., a first clock phase $\Phi_1$ associated with a first one of the charge switch 352). The charge switch 352 is closed in response to a rising edge of the first clock phase $\Phi_1$ to store an analog value of a current signal ($I_{sig}$), such as lin+ or lin−, in the sampling capacitor Cs.

Referring again to FIG. 8, in block 804, the analog value integrated in the charge sampler capacitor is quantized. For example, as shown in FIG. 3, the time-interleaved charge/dump sampler 350 may be a first stage of the analog-to-digital (ADC) converter. In this example, a quantizer (not shown) is coupled to each of the sampling capacitors Cs, for quantizing the analog value stored in the sampling capacitors Cs. For example, FIG. 4A illustrates quantizing periods (Q1, Q2, . . . , Q8) for quantizing analog values stored in the sampling capacitors Cs until they are dumped in response to the dump signal (D1, D2, . . . , D8).

At block 806, the charge sampler switch and a dump switch are controlled for attenuating the current-mode input signal at an aliasing frequency. For example, the timing diagram shown in FIG. 4A operates the time-interleaved charge/dump sampler 350 in a filtering response mode that includes inherent anti-alias filtering. Adjusting an integration window and splitting a current buffer for odd and even clock phases enable digital programming of the filtering response from the time-interleaved charge/dump sampler 350, when operating according to the timing diagram 400 of FIG. 4A. The method 800 may further include extending an integration window with two current buffers to feed a first differential input path and a second differential input path of the time-interleaved charge sampler, for example, as shown in FIGS. 6A and 6B.

According to a further aspect of the present disclosure, a receiver including a time-interleaved charge sampler is described. The receiver also includes means for driving the time-interleaved charge sampler. The driving means may include the current buffer of FIGS. 3, 5, 6A, 6B, and 7. The driving means may include a first driving means and a second driving means according to even phases and odd phases of a clock pulse signal. The first driving means may be the first current buffer 620-1, and the second driving means may be the second current buffer 620-2, as shown in FIGS. 6A and 6B. In another aspect, the aforementioned means may be any layer, module or any apparatus configured to perform the functions recited by the aforementioned means.

Figure 9:
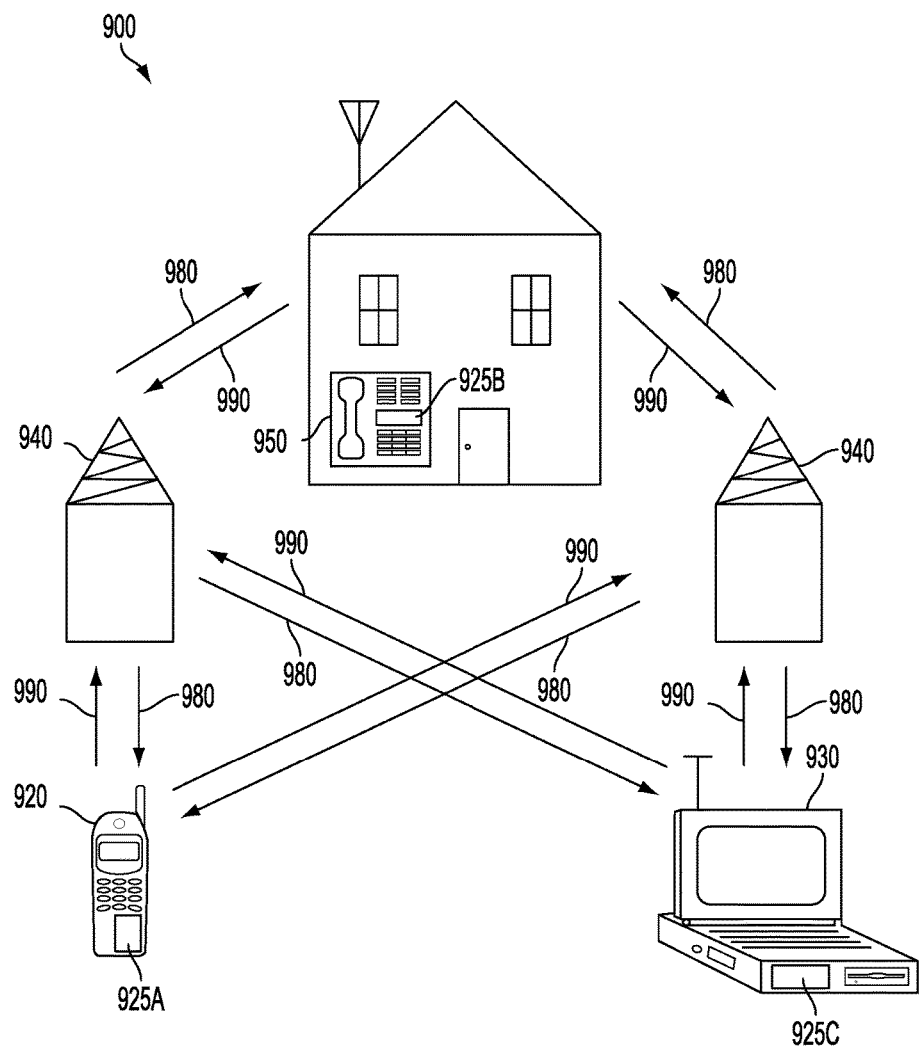
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed time-interleaved charge sampler. It will be recognized that other devices may also include the disclosed time-interleaved charge sampler, such as the base stations, user equipment, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed time-interleaved charge sampler.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A receiver comprising:
a time-interleaved charge sampler comprising a charge sampler switch in series with a charge sampler capacitor;
a current buffer configured to drive the time-interleaved charge sampler; and
a dump switch coupled to the current buffer and in parallel with the charge sampler capacitor.

2. The receiver of claim 1, in which the current buffer is differential and drives a first differential input path and a second differential input path of the time-interleaved charge sampler.

3. The receiver of claim 2, further comprising a reset switch coupled between the first differential input path and the second differential input path of the time-interleaved charge sampler.

4. The receiver of claim 1, integrated into a low-power 5G receiver.

5. The receiver of claim 1, integrated into a current steering digital-to-analog converter of a low-power 5G transmitter.

6. The receiver of claim 1, further comprising:
a differential low noise amplifier (LNA);
a mixer coupled in series with the differential LNA;
a current-mode filter coupled in series between the mixer and the current buffer, in which the differential LNA, the mixer, and the current-mode filter are integrated on a wireless transceiver (WTR) chip; and
an analog-to-digital converter (ADC) chip coupled to the WTR chip by a system-in-package (SIP) link, in which the current buffer and the time-interleaved charge sampler are integrated on the ADC chip.

7. The receiver of claim 1, further comprising a plurality of the charge sampler switch in series with a plurality of the charge sampler capacitor for each phase of a clock pulse signal.

8. The receiver of claim 1, in which the current buffer is directly coupled to the time-interleaved charge sampler.

9. The receiver of claim 1, in which the current buffer comprises a first current buffer and a second current buffer according to even phases and odd phases of a clock pulse signal.

10. A method of using a time-interleaved charge sampler, comprising:
sampling a current-mode input signal at a charge sampler switch to integrate an analog value of the current-mode input signal in a charge sampler capacitor;
quantizing the analog value integrated in the charge sampler capacitor; and
controlling the charge sampler switch and a dump switch to attenuate the current-mode input signal at an aliasing frequency.

11. The method of claim 10, further comprising:
generating clock phases to control the charge sampler switch and the dump switch; and
sampling edges of the clock phases to control the charge sampler switch and the dump switch, the edges aligned in time to attenuate the current-mode input signal at the aliasing frequency.

12. The method of claim 10, further comprising extending an integration window with two current buffers to feed a first differential input path and a second differential input path of the time-interleaved charge sampler.

13. The method of claim 12, in which extending the integration window changes a sampling rate and moves a notch frequency from a sampling frequency to half of the sampling frequency.

14. The method of claim 10, further comprising shorting a first differential input path and a second differential input path of the time-interleaved charge sampler during a non-overlapping clock period.

15. A receiver comprising:
a time-interleaved charge sampler comprising a charge sampler switch in series with a charge sampler capacitor;
means for driving the time-interleaved charge sampler; and
a dump switch coupled to the means for driving and in parallel with the charge sampler capacitor.

16. The receiver of claim 15, further comprising a reset switch coupled between a first differential input path and a second differential input path of the time-interleaved charge sampler.

17. The receiver of claim 15, further comprising:
a differential low noise amplifier (LNA);
a mixer coupled in series with the differential LNA;
a current-mode filter coupled in series between the mixer and the means for driving, in which the differential LNA, the mixer, and the current-mode filter are integrated on a wireless transceiver (WTR) chip; and an analog-to-digital converter (ADC) chip coupled to the WTR chip by a system-in-package (SIP) link, in which the means for driving and the time-interleaved charge sampler are integrated on the ADC chip.

18. The receiver of claim 15, in which the means for driving comprises a first driving means and a second driving means according to even phases and odd phases of a clock pulse signal.

* * * * *